United States Patent
Fan et al.

(10) Patent No.: US 11,398,813 B2
(45) Date of Patent: Jul. 26, 2022

(54) INTEGRATED OSCILLATOR

(71) Applicant: Arm Limited, Cambridge (GB)

(72) Inventors: Philex Ming-Yan Fan, Cambridge (GB); Parameshwarappa Anand Kumar Savanth, Cambridge (GB); Benoit Labbe, Cambridge (GB); Bal S. Sandhu, Fremont, CA (US); Pranay Prabhat, Cambridge (GB); James Edward Myers, Bottisham (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/157,483

(22) Filed: Jan. 25, 2021

(65) Prior Publication Data

US 2021/0143801 A1    May 13, 2021

Related U.S. Application Data

(63) Continuation of application No. 16/293,518, filed on Mar. 5, 2019, now Pat. No. 10,903,822.

(51) Int. Cl.
*H03K 3/0231* (2006.01)
*H02M 3/07* (2006.01)
*H03K 19/20* (2006.01)

(52) U.S. Cl.
CPC .......... *H03K 3/02315* (2013.01); *H02M 3/07* (2013.01); *H03K 19/20* (2013.01)

(58) Field of Classification Search
CPC ..... H03K 3/02315; H03K 19/20; H02M 3/07; H02M 2001/0032; Y02B 70/16
See application file for complete search history.

(56) References Cited

U.S. PATENT DOCUMENTS

| | | | | |
|---|---|---|---|---|
| 6,323,721 B1 * | 11/2001 | Proebsting | ............. | G11C 5/146 327/535 |
| 2016/0164401 A1 * | 6/2016 | Huang | ................. | H03K 17/063 327/536 |

* cited by examiner

*Primary Examiner* — Jung Kim
(74) *Attorney, Agent, or Firm* — Pramudji Law Group PLLC; Ari Pramudji

(57) ABSTRACT

Various implementations described herein refer to an integrated circuit having a first stage and a second stage. The first stage has a step-down converter coupled to an oscillator between a first voltage supply and a second voltage supply. The second stage is coupled to the first stage, and the second stage has a current bias generator coupled to a diode-connected transistor between the first voltage supply and the second voltage supply. The second stage provides an intermediate voltage to the first stage.

7 Claims, 5 Drawing Sheets

INTEGRATED OSCILLATOR

RELATED APPLICATIONS

This application is a continuation of patent application Ser. No. 16/293,518 filed 2019 Mar. 5, now U.S. Pat. No. 10,903,822, issued 2021 Jan. 16, titled INTEGRATED OSCILLATOR, and the entire disclosure of which is incorporated herein by reference.

The present disclosure was made with Government support under Agreement No. HR0011-17-9-0025, awarded by DARPA. The Government may have certain rights in reference to the present disclosure.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Some conventional RC oscillators may provide clock frequency below 100 kHz, but the means to reduce power/frequency (nW/kHz) while maintaining frequency stability is elusive and typically difficult to implement. Some miniaturized computing platforms may operate under restricted battery capacity due to their compact size, so a low duty cycle is commonly used to reduce power consumption, and thus, an ultra-low-power (<1000 nW) sleep timer as an always-on circuit is desired. Considering cost and board area needed by conventional crystal oscillators, an unconventional oscillating circuit may be of interest in terms of silicon development. Additionally, there is a need for frequency stability with use of an unconventional oscillating circuit that considers process variation.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to schemes and techniques for providing an integrated oscillator for low-power operation. In various implementations, the schemes and techniques described herein provide for an integrated resistor-capacitor (RC) oscillator having a forward body biasing circuit that reduces active power of the RC oscillator while maintaining frequency stability of the RC oscillator. The schemes and techniques described herein may provide for sub-threshold region operation of an integrated RC oscillator using a combination of on-chip generated supply voltage, a switched-capacitor, and forward body biasing (FBB) for ultra-low-power operation. When compared to a crystal oscillator, a low frequency RC oscillator as an always-on sleep timer may be used in some systems that have power and area constraints. As such, schemes and techniques described herein may provide for a low-power (e.g., 33 nW), low frequency (e.g., 33 kHz) RC oscillator that achieves a low-power/frequency in the sub-100 kHz region of operation. The schemes and techniques described herein employ sub-threshold region operation, built-in switched-capacitor circuit operation, and forward body biasing (FBB) to reduce active power while maintaining oscillator frequency stability. Considering cost and board area used by a conventional crystal oscillator, use of an on-chip RC oscillator may provide advantages in terms of silicon development, and frequency stability of an RC oscillator is substantially superior to a ring-oscillator when considering process variation.

Various implementation schemes and techniques for providing an integrated resistor-capacitor (RC) oscillator for low-power operation will now be described in detail herein with reference to FIGS. 1-3C.

Figure 1:
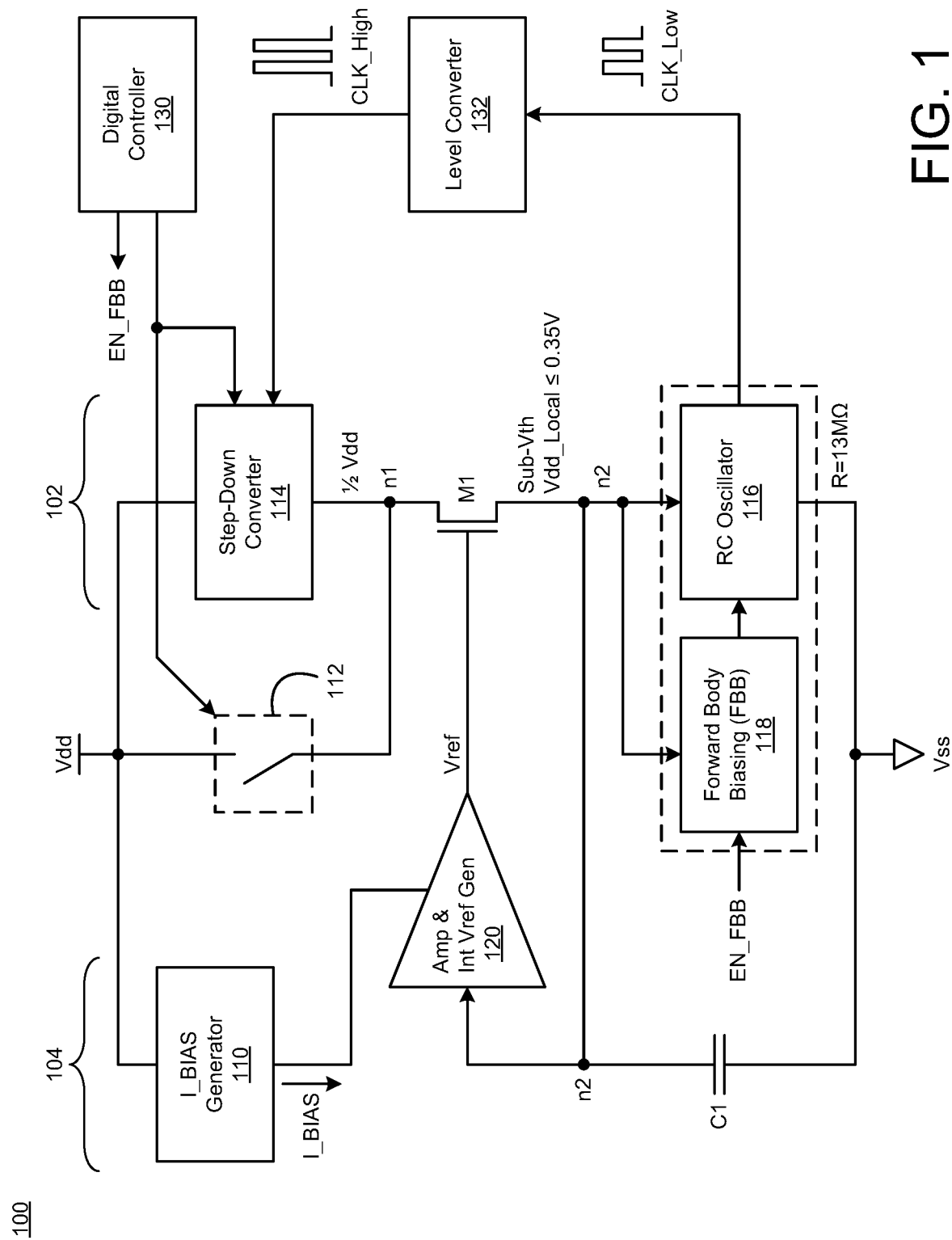
FIG. 1 illustrates a diagram of circuitry having an integrated oscillator for low-power operation in accordance with implementations described herein.

FIG. 1 illustrates a diagram of circuitry 100 having an integrated oscillator 116 for low-power operation in accordance with implementations described herein.

In reference to FIG. 1, the circuitry 100 may have multiple stages including a first stage 102 and a second stage 104. As shown, the first stage 102 may be coupled in parallel with the second stage 104, a digital controller 130 may be used to operate various components of the circuitry 100, and a level converter 132 may be used for level shifting a low-power clock signal (CLK_Low) to a high-power clock signal (CLK_High). In some instances, the low-power clock signal (CLK_Low) may refer to a low-voltage clock signal, and the high-power clock signal (CLK_High) may refer to high-voltage clock signal.

The first stage 102 includes a step-down converter (SDC) 114, a pass transistor (M1), and an oscillator 116 that are coupled in series between an operating supply voltage (Vdd) and ground (Vss). The oscillator 116 may be a resistor-capacitor (RC) oscillator 116 that has a forward body biasing (FBB) circuit 118. The RC oscillator 116 may be a low-power and low-frequency RC oscillator, and in some instances, the low-frequency may refer to an operating frequency of less than 100 kHz. The forward body biasing (FBB) circuit 118 uses an intermediate voltage (Vdd_Local) to reduce active power of the RC oscillator 116 while maintaining frequency stability of the RC oscillator 116. In various instances, the RC oscillator 116 may provide for an increased scale in resistance of up to, e.g., R=13MΩ. The step-down converter (SDC) 114 may be referred to as a switched capacitor (SC) or a voltage divider circuit. Further scope and various operational features related to the step-down circuit 114 is described in reference to FIG. 3B.

Various types of complementary metal-oxide-semiconductor (CMOS) devices may be used in the circuitry 100. In some instances, the pass transistor (M1) may be an n-type transistor, such as, e.g., an n-type MOS (NMOS) transistor. However, in other instances, the pass transistor (M1) may be implemented with a p-type transistor, such as, e.g., p-type MOS (PMOS) transistor.

The second stage 104 is coupled to the first stage 102, and the second stage 104 has a current bias generator 110, an amplifier circuit 120, and a capacitor (C1) that are coupled between the operating supply voltage (Vdd) and ground (Vss). The current bias generator 110 may be an on-chip current bias generator. The amplifier circuit 120 may be referred to as an operational amplifier (Amp) and internal reference voltage (Vref) generator 120 that may be configured to generate and provide a reference voltage (Vref) to a gate of the pass transistor (M1).

The circuitry 100 includes a switch 112 that is coupled between the first voltage supply (Vdd) and node (n1), which is disposed between the step-down converter 114 and the pass transistor (M1). The switch 112 is also coupled in parallel with the step-down converter 114, and the pass transistor (M1) is coupled to the oscillator 116 via node (n2). The capacitor (C1) is coupled to the pass transistor (M1) between node (n2) and ground (Vss). The capacitor (C1) is also coupled in parallel with the oscillator 116 between the input of the oscillator 116 at node (n2) and ground (Vss). In addition, the capacitor (C1) is coupled to the input of the operational amplifier (Amp) and internal reference voltage (Vref) generator 120 between node (n2) and ground (Vss).

The circuitry 100 includes the digital controller 130 that is coupled to the switch 112 and the step-down converter 114. The digital controller 130 is operable to activate and deactivate the step-down converter 114 so as to assist with providing an intermediate voltage (Vdd_Local) to the first stage 102. The digital controller 130 is operable to activate and deactivate the switch 112. The digital controller 130 may be configured to generate and provide an enable signal (EN_FBB) to the FBB circuit 118. Additional scope and operational features of the digital controller 130 are described in reference to FIG. 2.

The circuitry 100 includes a voltage level converter 132 (or voltage level shifter) that is coupled between the RC oscillator 116 and the step-down converter 114, and the voltage level converter 132 (or voltage level shifter) may provide a clock signal (CLK_High) with a voltage level similar to the operating supply voltage (Vdd) to the step-down converter 114 (or switched capacitor). As shown in FIG. 1, the level converter 132 (or voltage level shifter) may be used for level shifting a low-voltage clock signal (CLK_Low) received from the RC oscillator 116 to a high-voltage clock signal (CLK_High). In some instances, low-voltage may refer to low-power, and high-voltage may refer to high-power. Also, the step-down converter 114 may provide a voltage level of half-Vdd (½ Vdd) to node (n1) that passes through the pass transistor (M1). In this instance, the intermediate voltage (Vdd_Local) may have a sub-Vth level (sub-threshold voltage level) of less than or equal to 0.35V, which is provided to node (n2). Also, the half-Vdd reduces voltage drop across M1, or the voltage drop between n1 and n2, from (Vdd-Vdd_Local) to (½ Vdd-Vdd_Local), which saves power. Also, in this instance, the RC oscillator 116 receives the intermediate voltage (Vdd_Local) from the pass transistor (M1) via node (n2), and the FBB circuit 118 receives the intermediate voltage (Vdd_Local) from the pass transistor (M1) via node (n2). Additional scope and various operational features and characteristics related to the RC oscillator 116 and the forward body biasing (FBB) circuit 118 is described in reference to FIG. 3C.

As shown in FIG. 1, the RC oscillator 116 along with the FBB circuit 118 may receive the enable signal (EN_FBB) from the digital controller 130 and operate to provide a low-voltage clock signal (CLK_Low) to the voltage level converter 132 (or voltage level shifter) based on the enable signal (EN_FBB). Also, as shown, the voltage level converter 132 (or voltage level shifter) receives the low-voltage clock signal (CLK) and provides the high-voltage clock signal (CLK_High) to the step-down converter (SDC) 114.

The circuitry 100 includes an operational amplifier (Amp) and internal reference voltage (Vref) generator 120 that is coupled between the capacitor (C1) and a gate of the pass transistor (M1), and the current bias generator 110 provides a bias current (I_BIAS) to a power supply connection of the operational amplifier and internal reference voltage generator 120. As shown in FIG. 1, an output of the pass transistor (M1) is coupled to an input of the operational amplifier (M1) and internal reference voltage generator 120 via node (n2). Also, as shown, an output of the operational amplifier and internal reference voltage generator 120 is coupled to gate of the pass transistor (M1).

The operating supply voltage (Vdd) may be referred to as a first voltage supply, and ground (Vss) may be referred to as a second voltage supply, and the voltage levels of the operating supply voltage (Vdd), ground (Vss), and intermediate voltage (Vdd_Local) may vary depending on particular implementations. For instance, the operating supply voltage (Vdd) refers to a positive voltage supply that is greater than zero volts (0V), and the operating supply voltage (Vdd) may operate within a voltage range of 0.5V to 2.4V, and in some instances, between 1.0V and 1.5V. The ground voltage supply (Vss or Gnd) refers to ground (Gnd) or a ground voltage having zero volts (0V). In various instances, the intermediate voltage (Vdd_Local) may refer to a positive voltage supply that is greater than zero volts (0V), and also, the intermediate voltage (Vdd_Local) may operate within a voltage range of 0V and 0.5V, and in some instances, between 0.3V and 0.4V.

The circuitry 100 and the various components thereof may be fabricated and implemented as an integrated circuit (IC), and as such, the circuitry 100 may be integrated with various types of logic circuitry and related components on a single chip. The circuitry 100 may be implemented in embedded systems for various types of electronic, mobile, biometric, and/or various Internet-of-Things (IoT) applications.

In some implementations, in addition to scaling-up R to 13MΩ, the circuitry 100 scales the sub-threshold (sub-Vth) Vdd_Local to supply the RC oscillator 116. Also, the R scaling contributes to a power reduction of the RC oscillator 116, and the Vdd_Local scaling reduces power. Therefore, the circuitry 100 may substantially decrease RC power while saving silicon chip area. Also, the pass transistor (M1) may consume less power due to a dropout voltage between Vdd=1.2V and Vdd_Local and a large current drawn from Vdd through M1 to the RC oscillator 116. The dropout power may be reduced by a smaller current drawn by the RC oscillator 116, and the step-down converter 114 may reduce the dropout voltage (e.g., ½Vdd-0.35V). Also, the digital controller 130 may be used to avoid latch-up due to forward body biasing (FBB) during active power-on when Vdd_Local is not ready to supply the RC oscillator 116.

Figure 2:
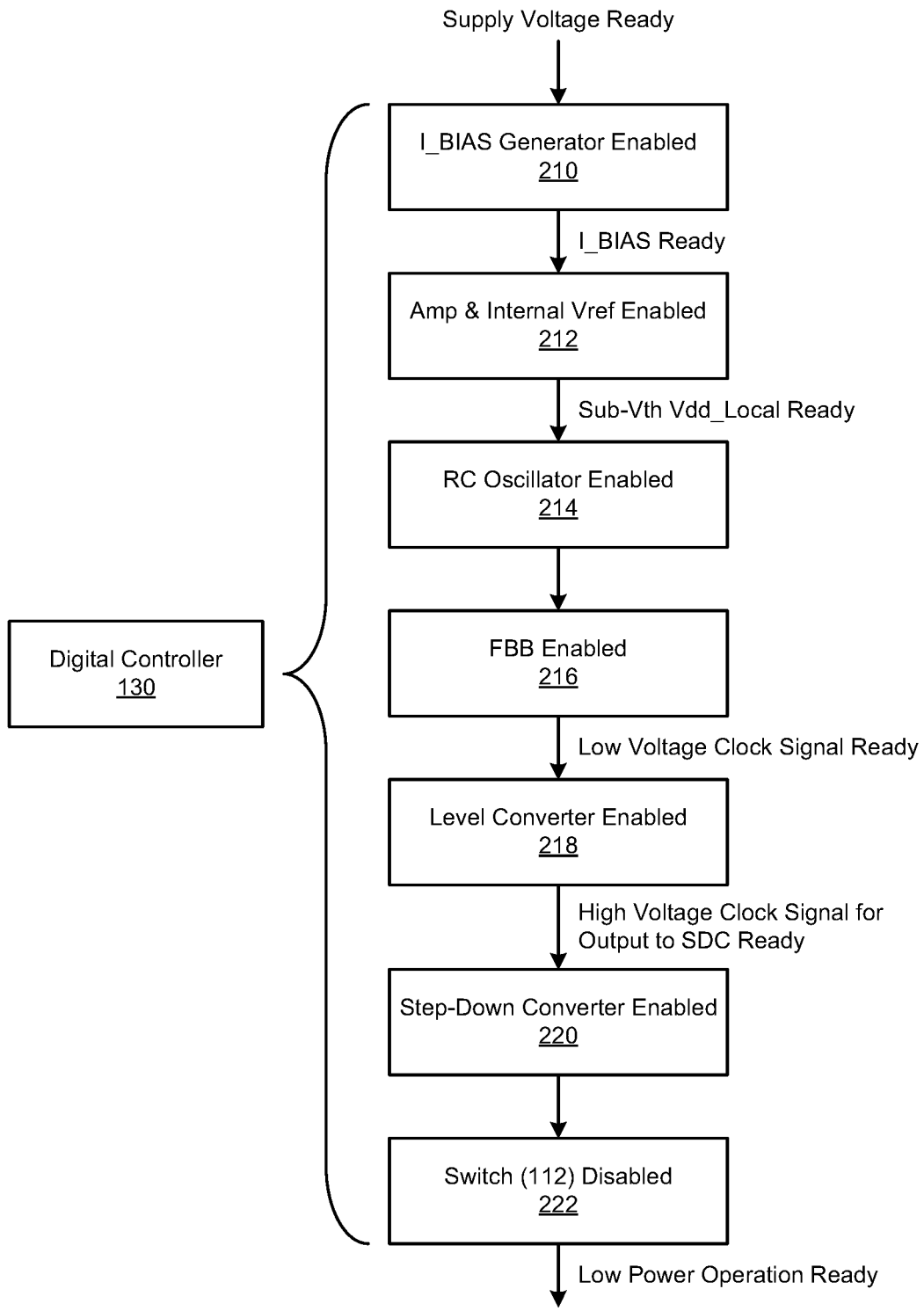
FIG. 2 illustrates a process diagram of a method for operating circuitry having an integrated oscillator in accordance with implementations described herein.

FIG. 2 illustrates a process diagram of a method 200 for operating circuitry having an integrated oscillator in accordance with implementations described herein.

It should be understood that even though method 200 may indicate a particular order of operation execution, in some cases, various certain portions of operations may be executed in a different order, and on different systems. In some other cases, additional operations and/or steps may be added to and/or omitted from method 200. Method 200 may be implemented in hardware and/or software. If implemented in hardware, method 200 may be implemented with various components, such as described herein above in reference to FIG. 1. If implemented in software, method 200 may be implemented as a program or software instruction process that may be configured for implementing various schemes and techniques as described herein. Also, if implemented in software, various instructions related to implementing method 200 may be stored in memory, wherein a computer, a server, or various other computing devices (e.g., digital controller 130) having a processor and memory may be configured to perform method 200.

In reference to FIG. 2, method 200 may be used by the digital controller 106 of FIG. 1 to implement various schemes and techniques described herein. For instance, method 200 provides for a power-on sequence by the digital controller 130.

At block 210, when the supply voltage (Vdd) is ready, method 200 may enable the current bias (I_BIAS) generator 110 such that the bias current (I_BIAS) is ready.

At block 212, when the bias current (I_BIAS) is ready, method 200 may enable the operational amplifier and internal reference voltage (Vref) circuit 120 such that the sub-threshold (sub-Vth) intermediate voltage (Vdd_Local) is ready.

At block 214, when the sub-Vth Vdd_Local is ready, method 200 may enable the RC oscillator 116, and further, at block 216, method 200 enables the forward body biasing (FBB) such that the low-voltage clock signal (CLK_Low) is ready.

At block 218, when the low-voltage clock signal (CLK_Low) is ready, method 200 enables the level converter 132 (or voltage level shifter) such that the high-voltage clock signal (CLK_High) is ready for output to the step-down converter (SDC) 114.

At block 220, when the CLK_High is ready for output to the SDC 114, method 200 enables the step-down converter (SDC) 114, and at block 222, method 200 disables the switch 112 such that low-power operation is ready.

Figure 3A:
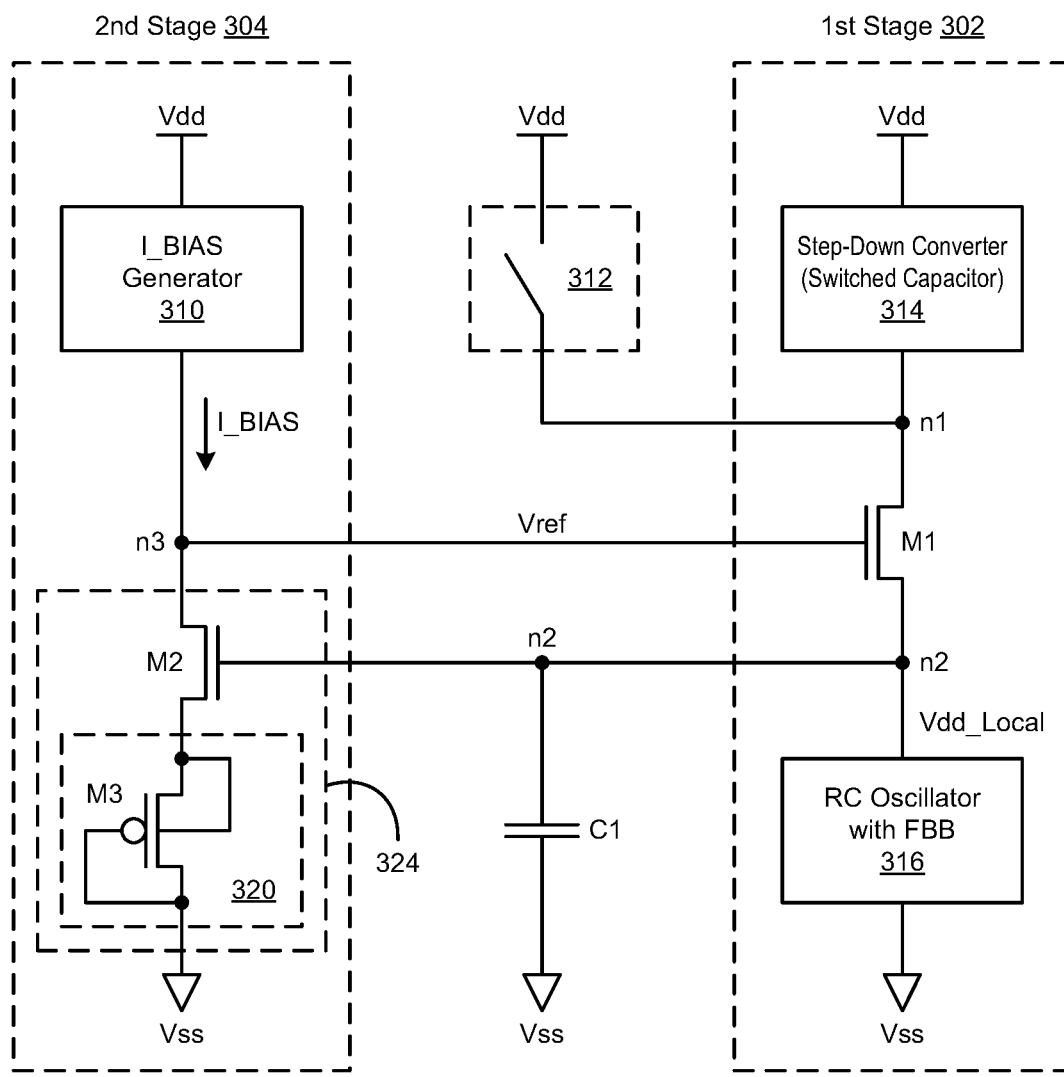
FIGS. 3A-3C illustrate diagrams of multi-stage circuitry having an integrated oscillator in accordance with various implementations described herein.
Figure 3B:
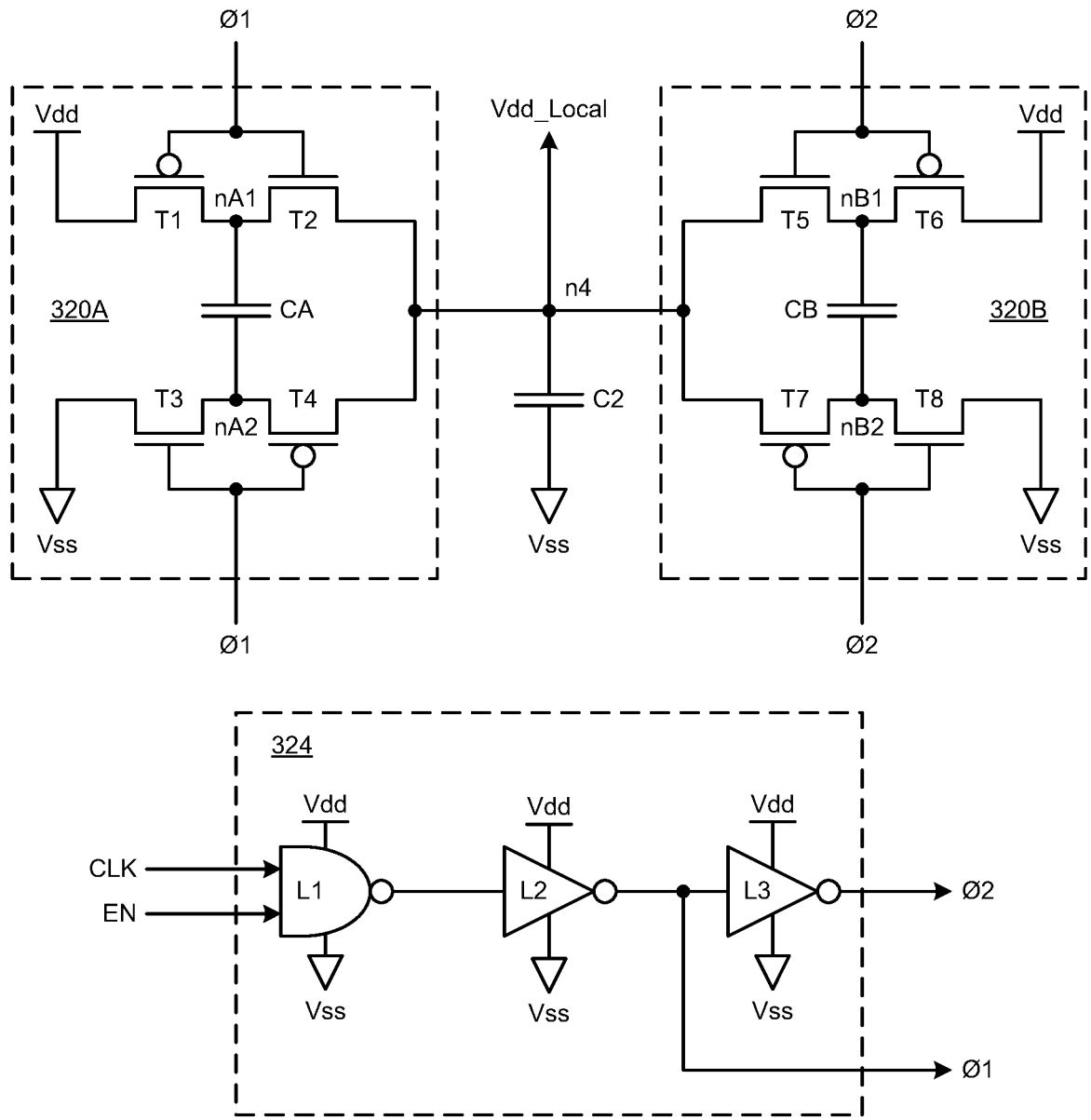
Figure 3C:
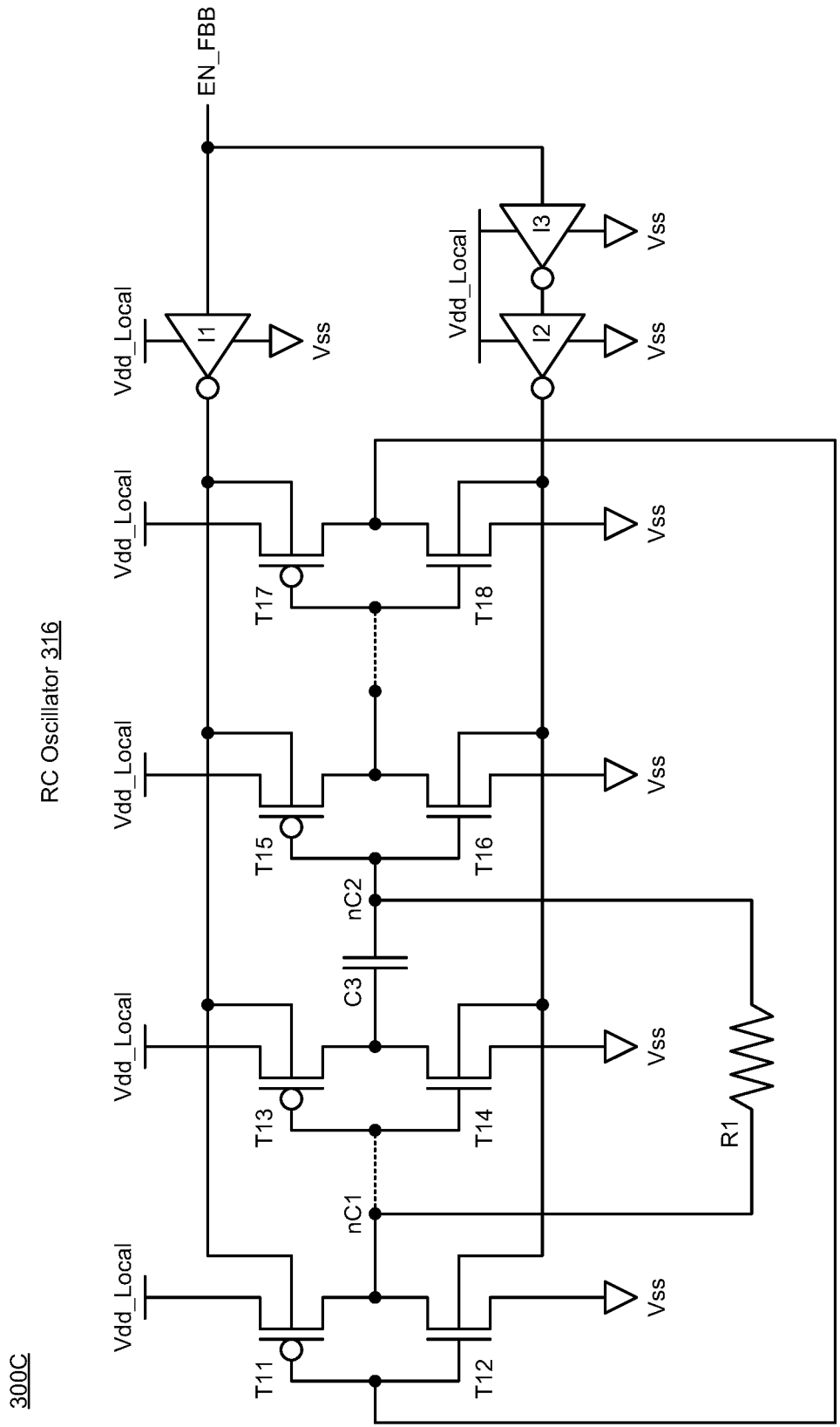

FIGS. 3A-3C illustrate various diagrams of multi-stage circuitry 300 having an integrated oscillator 316 in accordance with various implementations described herein. In particular, FIG. 3A illustrates a diagram 300A of the multi-stage circuitry 300 having the integrated oscillator 316 and a step-down converter 314, FIG. 3B illustrates a diagram 300B of the step-down converter 314, and also, FIG. 3C illustrates a diagram 300C of the integrated oscillator 316. The multi-stage circuitry 300 in FIG. 3A may have similar components and features as described in reference to the circuitry 100 of FIG. 1.

In reference to FIG. 3A, the multi-stage circuitry 300 may include a first stage 302 having a step-down converter 314 that is coupled to an oscillator 316 between a first voltage supply (Vdd) and a second voltage supply (Vss or Gnd). The step-down converter 314 may be a switched capacitor (SC) or a voltage divider.

The oscillator 316 may be a resistor-capacitor (RC) oscillator that operates with low-power and low-frequency. In some instances, low-frequency refers to an operating frequency of less than 100 kHz. The oscillator 316 may include a forward body biasing (FBB) circuit (e.g., as shown in FIG. 3C), and the intermediate voltage (Vdd_Local) may be used by the oscillator 316 and the forward body biasing (FBB) circuit to reduce active power of the oscillator 316 while maintaining frequency stability of the oscillator 316.

The multi-stage circuitry 300 may include a second stage 304 that is coupled to the first stage 302, and the second stage 304 has a current bias generator 310 that is coupled to a diode structure 320 between the first voltage supply (Vdd) and the second voltage supply (Vss or Gnd). The current bias generator 310 may be an on-chip current bias generator. The second stage 304 may be coupled in parallel with the first stage 302. The diode structure 320 may be a diode-connected transistor (M3). The second stage 304 may assist with providing an intermediate voltage (Vdd_Local) to the first stage 302, e.g., by activating a first pass transistor (M1) with a reference voltage (Vref).

The multi-stage circuitry 300 includes multiple pass transistors, such as, e.g., the first pass transistor (M1) and a second pass transistor (M2). In some instances, the first pass transistor (M1) and the second pass transistor (M2) are n-type transistors, such as, e.g., NMOS transistors. However, in other instances, the first pass transistor (M1) and the second pass transistor (M2) may implemented with p-type transistors, such as, e.g., PMOS transistors.

The first pass transistor (M1) may be coupled between the step-down converter 314 and the oscillator 316, and as shown, an output of the current bias generator 310 may be coupled to a gate of the first pass transistor (M1). Also, the step-down converter 314, the first pass transistor (M1), and the oscillator 316 are coupled in series between the first voltage supply (Vdd) and the second voltage supply (Vss or Gnd).

The second pass transistor (M2) may be coupled between the current bias generator 310 and the diode-connected transistor (M3), and as shown, an input of the oscillator 316 may be coupled to a gate of the second pass transistor (M2). The current bias generator 310, the second pass transistor (M2), and the diode-connected transistor (M3) are coupled in series between the first voltage supply (Vdd) and the second voltage supply (Vss or Gnd). In some instances, the second stage 304 has an internal reference voltage (Vref) generator 324, and the second pass transistor (M2) along with the diode-connected transistor (M3) operate as the internal Vref generator 324. In this instance, the internal reference voltage (Vref) generator 324 is configured to generate and provide the reference voltage (Vref) to a gate of the first pass transistor (M1) via node n3.

The multi-stage circuitry 300 includes a capacitor (C1) that is coupled between a gate of the second pass transistor (M2) and the second supply voltage (Vss or Gnd), and the capacitor (C1) may be coupled in parallel with the oscillator 316 between the input of the oscillator 316 and the second voltage supply (Vss or Gnd).

The multi-stage circuitry 300 may include a switch 312 that is coupled between the first voltage supply (Vdd) and a first node (n1), which is disposed between the step-down converter 314 and the first pass transistor (M1). Also, as shown, the switch 312 may be coupled in parallel with the step-down converter 314. The first pass transistor (M1) is coupled to the oscillator 316 via a second node (n2). The capacitor (C1) is coupled to the first pass transistor (M1) between the second node (n2) and the second voltage supply (Vss or Gnd). The capacitor (C1) is also coupled to the input of the oscillator 316 between the second node (n2) and the second voltage supply (Vss or Gnd). The capacitor (C1) is also coupled to the gate of the second pass transistor (M2) between the second node (n2) and the second voltage supply (Vss or Gnd).

The current bias generator 310 provides a current bias (I_BIAS) to a gate of the first pass transistor (M1) via a third node (n3), which is disposed between the current bias generator 310 and the second pass transistor (M2). The current bias generator 310 also provides the current bias (I_BIAS) to the second pass transistor (M2) via the third node (n3). The second pass transistor (M3) is coupled between the current bias generator 310 at the third node (n3) and the diode-connected transistor (M3), which is coupled between the second pass transistor (M2) and the second voltage supply (Vss or Gnd). As shown, an input of the diode-connected transistor (M3) is coupled to a body biasing terminal of M3, and an output of the diode-connected transistor (M3) is coupled to a gate of M3.

The voltage levels of the first voltage supply (Vdd), the second voltage supply (Vss or Gnd), and the intermediate voltage (Vdd_Local) may vary depending on particular implementations. For instance, the first voltage supply (Vdd) refers to a positive voltage supply that is greater than zero volts (0V), and the first voltage supply (Vdd) may operate within a voltage range between 1.0V to 1.5V. The second voltage supply (Vss or Gnd) refers to ground (Gnd) or a ground voltage having zero volts (0V). In various instances, the intermediate voltage (Vdd_Local) may refer to a positive voltage supply that is greater than zero volts (0V), and also, the intermediate voltage (Vdd_Local) may operate within a voltage range between 0.3V and 0.4V.

The circuitry 300 and the various components thereof may be fabricated and implemented as an integrated circuit (IC), and as such, the circuitry 300 may be integrated with various types of logic circuitry and related components on a single chip. The circuitry 300 may be implemented in embedded systems for various types of electronic, mobile, biometric and/or various Internet-of-Things (IoT) applications.

As shown in FIG. 3B, the step-down converter 314 may include a first circuit 320A and a second circuit 320B that is a mirror of the first circuit 320A. The first circuit 320A is coupled to the second circuit 320B at node (n4), and capacitor (C2) is coupled between node (n4) and the second voltage supply (Vss or Gnd). In some instances, the intermediate voltage (Vdd_Local) may be provided from node (n4).

The first circuit 320A may include multiple transistors (T1, T2, T3, T4) and a capacitor (CA) that are coupled together and arranged between the first voltage supply (Vdd), the second voltage supply (Vss or Gnd), and node (n4). The transistors (T1, T2) are coupled together as an inverter between the first voltage supply (Vdd) and node (n4) with a first clock signal (Ø1) coupled to gates of transistors (T1, T2). The transistors (T3, T4) are coupled together as another inverter between node (n4) and the second voltage supply (Vss or Gnd) with the first clock signal (Ø1) coupled to gates of the transistors (T3, T4). The capacitor (CA) is coupled between the inverter (T1, T2) at node (nA1) and the other inverter (T3, T4) at another node (nA2).

The second circuit 320B may include multiple transistors (T5, T6, T7, T8) and a capacitor (CB) that are coupled together and arranged between the first voltage supply (Vdd), the second voltage supply (Vss or Gnd), and node (n4). The transistors (T5, T6) are coupled together as an inverter between the first voltage supply (Vdd) and node (n4) with a second clock signal (Ø2) coupled to gates of transistors (T5, T6). The transistors (T7, T8) are coupled together as another inverter between node (n4) and the second voltage supply (Vss or Gnd) with the second clock signal (Ø2) coupled to gates of the transistors (T7, T8). Also, the capacitor (CB) is coupled between the inverter (T5, T6) at node (nB1) and the other inverter (T7, T8) at another node (nB2).

As also shown in FIG. 3B, the step-down converter 314 may include a clock circuit 324 having multiple logic devices (L1, L2, L3) that are coupled in series to receive input signals (CLK, EN) and provide multiple clock signals, including the first clock signal (Ø1) and the second clock signal (æ2). The input signals (CLK, EN) may include a first input signal (CLK) that refers to an input clock signal and a second input signal that refers to an input enable signal. The multiple logic devices (L1, L2, L3) include a first logic device (L1), such as, e.g., a NAND gate, that receives the input signals (CLK, EN) and provides a first output signal to a second logic gate (L2). Also, the multiple logic devices (L1, L2, L3) include the second logic device (L2), such as, e.g., a NOT gate or inverter, that receives the first output signal from the first logic device (L1) and provides a second output signal to a third logic gate (L3). The second output signal is provided as an output of the first clock signal (Ø1) from the clock circuit 324. The multiple logic devices (L1, L2, L3) include the third logic device (L3), such as, e.g., a NOT gate or inverter, that receives the second output signal from the second logic device (L2) and provides a third output signal as an output of the second clock signal (Ø2) from the clock circuit 324. Further, as shown in FIG. 3B, the clock circuit 324 may provide the first clock signal (Ø1) and the second clock signal (Ø2) to the first circuit 320A and the second circuit 320B of the step-down converter 314 (or switched capacitor, or voltage divider).

As shown in FIG. 3C, the oscillator 316 may include an inverter chain having multiple inverters coupled together in series. The multiple inverters include a first inverter (T11, T12), a second inverter (T13, T14), a third inverter (T15, T16), and a fourth inverter (T17, T18) with an output of the fourth inverter (T17, T18) coupled to an input of the first inverter (T11, T12). The multiple inverters are coupled between the intermediate voltage (Vdd_Local) and the second voltage (Vss or Gnd). The oscillator 316 includes a resistor (R1) that is coupled between an output of the first inverter (T11, T12) at node (nC1) and an input of the third inverter (T15, T16) at node (nC2). Also, the oscillator 316 includes a capacitor (C3) that is coupled between an output of the second inverter (T13, T14) and the input of the third inverter (T15, T16) at node (nC2).

Also, as shown, the transistors (T11, T12, T13, T14, T15, T16, T17, T18) are biased with the enable signal (EN_FBB) via multiple inverters (I1, I2, I3) that are coupled to body biasing terminals of the transistors (T11, T12, T13, T14, T15, T16, T17, T18), which are coupled between the intermediate voltage (Vdd_Local) and the second voltage (Vss or Gnd). The multiple inverters (I1, I2, I3) may include a first inverter (I1) that receives the enable signal (EN_FBB) and provides a first biasing signal as a single inversion of the enable signal (EN_FBB) to the body biasing terminals of the transistors (T11, T13, T15, T17). Also, the multiple inverters (I1, I2, I3) may include a second inverter (I2) and a third inverter (I3) that are coupled in series to receive the enable signal (EN_FBB) and provide a second biasing signal as a double inversion of the enable signal (EN_FBB) to the body biasing terminal of the transistors (T12, T14, T16, T18).

Described herein are various implementations of an integrated circuit. The integrated circuit may include a first stage having a step-down converter coupled to an oscillator between a first voltage supply and a second voltage supply. The integrated circuit may include a second stage coupled to the first stage, and the second stage may have a current bias generator coupled to a diode-connected transistor between the first voltage supply and the second voltage supply. The second stage may provide an intermediate voltage to the first stage.

Described herein are various implementations of an integrated circuit. The integrated circuit may include a first stage having a switched capacitor, a first pass transistor and an oscillator coupled between a first voltage supply and a second voltage supply. The first pass transistor may be coupled between the switched capacitor and the oscillator. The integrated circuit may include a second stage having a current bias generator, a second pass transistor and a diode-connected transistor coupled between the first voltage supply and the second voltage supply. The second pass transistor may be coupled between the current bias generator and the diode-connected transistor.

Described herein are various implementations of an integrated circuit. The integrated circuit may include a first stage having a step-down converter, a pass transistor and a resistor-capacitor oscillator coupled in series between an operating supply voltage and ground. The resistor-capacitor oscillator may have a forward body biasing circuit. The integrated circuit may include a second stage coupled to the first stage, and the second stage may have a current bias generator, an amplifier circuit and a capacitor coupled between the operating supply voltage and ground. The integrated circuit may include a digital controller that activates and deactivates the step-down converter to assist with providing an intermediate voltage from the second stage to the first stage. The forward body biasing circuit may use the intermediate voltage to reduce active power of the resistor-capacitor oscillator while maintaining frequency stability of the resistor-capacitor oscillator.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit comprising:
    a first stage having a switched capacitor, a first transistor and an oscillator coupled between a supply voltage and ground, wherein the first transistor is coupled between the switched capacitor and the oscillator; and
    a second stage having a current bias generator, a second transistor and a third transistor coupled between the supply voltage and ground, wherein the second transistor is coupled between the current bias generator and the third transistor,
    wherein an input of the oscillator is coupled to a gate of the second transistor.

2. A circuit comprising:
    a first stage having a switched capacitor, a first transistor and an oscillator coupled between a supply voltage and ground, wherein the first transistor is coupled between the switched capacitor and the oscillator; and
    a second stage having a current bias generator, a second transistor and a third transistor coupled between the supply voltage and ground, wherein the second transistor is coupled between the current bias generator and the third transistor,
    wherein the third transistor refers to a diode-connected transistor,
    wherein an input of the oscillator is coupled to a gate of the second transistor, and
    wherein an output of the current bias generator is coupled to a gate of the first transistor.

3. The circuit of claim 1, wherein:
the second stage is coupled in parallel with the first stage,
the switched capacitor, the first transistor and the oscillator are coupled in series between the supply voltage and ground, and
the current bias generator, the second transistor and the third transistor are coupled in series between the supply voltage and the ground.

4. A circuit comprising:
a first stage having a switched capacitor, a first transistor and an oscillator coupled between a supply voltage and ground, wherein the first transistor is coupled between the switched capacitor and the oscillator; and
a second stage having a current bias generator, a second transistor and a third transistor coupled between the supply voltage and ground, wherein the second transistor is coupled between the current bias generator and the third transistor,
wherein the current bias generator is configured to provide a reference voltage to a gate of the first transistor and to an input of the second transistor, and
wherein the second transistor passes the reference voltage to the third transistor based on activation by an intermediate voltage provided by the first transistor.

5. A circuit comprising:
a first stage having a switched capacitor, a first transistor and an oscillator coupled between a supply voltage and ground, wherein the first transistor is coupled between the switched capacitor and the oscillator; and
a second stage having a current bias generator, a second transistor and a third transistor coupled between the supply voltage and ground, wherein the second transistor is coupled between the current bias generator and the third transistor,
wherein the oscillator includes a forward body biasing circuit,
wherein the second stage provides a reference voltage to a gate of the first transistor so as to pass an intermediate voltage to the forward body biasing circuit, and
wherein the intermediate voltage is used by the forward body biasing circuit to reduce active power of the oscillator while maintaining frequency stability of the oscillator.

6. A circuit comprising:
a first stage having a switched capacitor, a first transistor and an oscillator coupled between a supply voltage and ground, wherein the first transistor is coupled between the switched capacitor and the oscillator;
a second stage having a current bias generator, a second transistor and a third transistor coupled between the supply voltage and ground, wherein the second transistor is coupled between the current bias generator and the third transistor; and
a capacitor coupled between a gate of the second transistor and ground,
wherein the capacitor is coupled in parallel with the oscillator between an input of the oscillator and ground.

7. A circuit comprising:
a first stage having a switched capacitor, a first transistor and an oscillator coupled between a supply voltage and ground, wherein the first transistor is coupled between the switched capacitor and the oscillator;
a second stage having a current bias generator, a second transistor and a third transistor coupled between the supply voltage and ground, wherein the second transistor is coupled between the current bias generator and the third transistor; and
a switch coupled between the supply voltage and a node disposed between the switched capacitor and the first transistor,
wherein the switch is coupled in parallel with the switched capacitor.

* * * * *